(12) United States Patent  
Kusukawa et al.

(10) Patent No.: US 12,132,014 B2  
(45) Date of Patent: Oct. 29, 2024

(54) POWER SEMICONDUCTOR APPARATUS

(71) Applicant: HITACHI, LTD., Tokyo (JP)

(72) Inventors: Junpei Kusukawa, Tokyo (JP); Eiichi Ide, Tokyo (JP)

(73) Assignee: HITACHI, LTD., Tokyo (JP)

( * ) Notice: Subject to any disclaimer, the term of this patent is extended or adjusted under 35 U.S.C. 154(b) by 377 days.

(21) Appl. No.: 17/622,588

(22) PCT Filed: Jul. 8, 2020

(86) PCT No.: PCT/JP2020/026751  
§ 371 (c)(1),  
(2) Date: Dec. 23, 2021

(87) PCT Pub. No.: WO2021/014979  
PCT Pub. Date: Jan. 28, 2021

(65) Prior Publication Data  
US 2022/0359434 A1 Nov. 10, 2022

(30) Foreign Application Priority Data

Jul. 24, 2019 (JP) ................................. 2019-136453

(51) Int. Cl.  
*H01L 25/16* (2023.01)  
*H01L 23/00* (2006.01)  
(Continued)

(52) U.S. Cl.  
CPC .............. *H01L 23/60* (2013.01); *H01L 25/16* (2013.01); *H01L 23/3735* (2013.01);  
(Continued)

(58) Field of Classification Search  
None  
See application file for complete search history.

(56) References Cited

U.S. PATENT DOCUMENTS

2008/0192437 A1* 8/2008 Furuta .................... H01L 24/33  
361/728  
2013/0277800 A1 10/2013 Hori et al.  
(Continued)

FOREIGN PATENT DOCUMENTS

DE 19615112 A1 * 10/1997 ............. H01L 25/16  
JP 2016-059147 4/2016

OTHER PUBLICATIONS

International Search Report with English translation and Written Opinion issued in corresponding application No. PCT/JP2020/026751 dated Oct. 6, 2020.  
(Continued)

*Primary Examiner* — Michelle Mandala  
*Assistant Examiner* — Jordan M Klein  
(74) *Attorney, Agent, or Firm* — Foley & Lardner LLP

(57) ABSTRACT

A power semiconductor apparatus provided with a first conductor section connected to a direct-current terminal for transmitting direct-current power; a second conductor section connected to an alternating-current terminal for transmitting alternating-current power; a semiconductor element which is disposed between the first conductor section and the second conductor section and is for converting the direct-current power to the alternating-current power; and an interposition section disposed between the first conductor section and the second conductor section, in which the interposition section has a first conductor layer connected to the first conductor section, a second conductor layer connected to the second conductor section, and a plurality of insulation layers disposed between the first conductor layer and the second conductor layer, with one or a plurality of third conductor layers sandwiched between the plurality of insulation layers.

6 Claims, 12 Drawing Sheets

(51) Int. Cl.
*H01L 23/60* (2006.01)
*H01L 23/373* (2006.01)

(52) U.S. Cl.
CPC .............. *H01L 24/32* (2013.01); *H01L 24/33* (2013.01); *H01L 2224/32225* (2013.01); *H01L 2224/32245* (2013.01); *H01L 2224/3303* (2013.01); *H01L 2224/33181* (2013.01)

(56) References Cited

U.S. PATENT DOCUMENTS

| | | |
|---|---|---|
| 2014/0131845 A1 | 5/2014 | Imai et al. |
| 2018/0211938 A1 | 7/2018 | Tsuyuno et al. |

OTHER PUBLICATIONS

Extended European Search Report issued in corresponding European Patent Application No. 20844914.0, dated Oct. 6, 2023 (10 pages).

\* cited by examiner

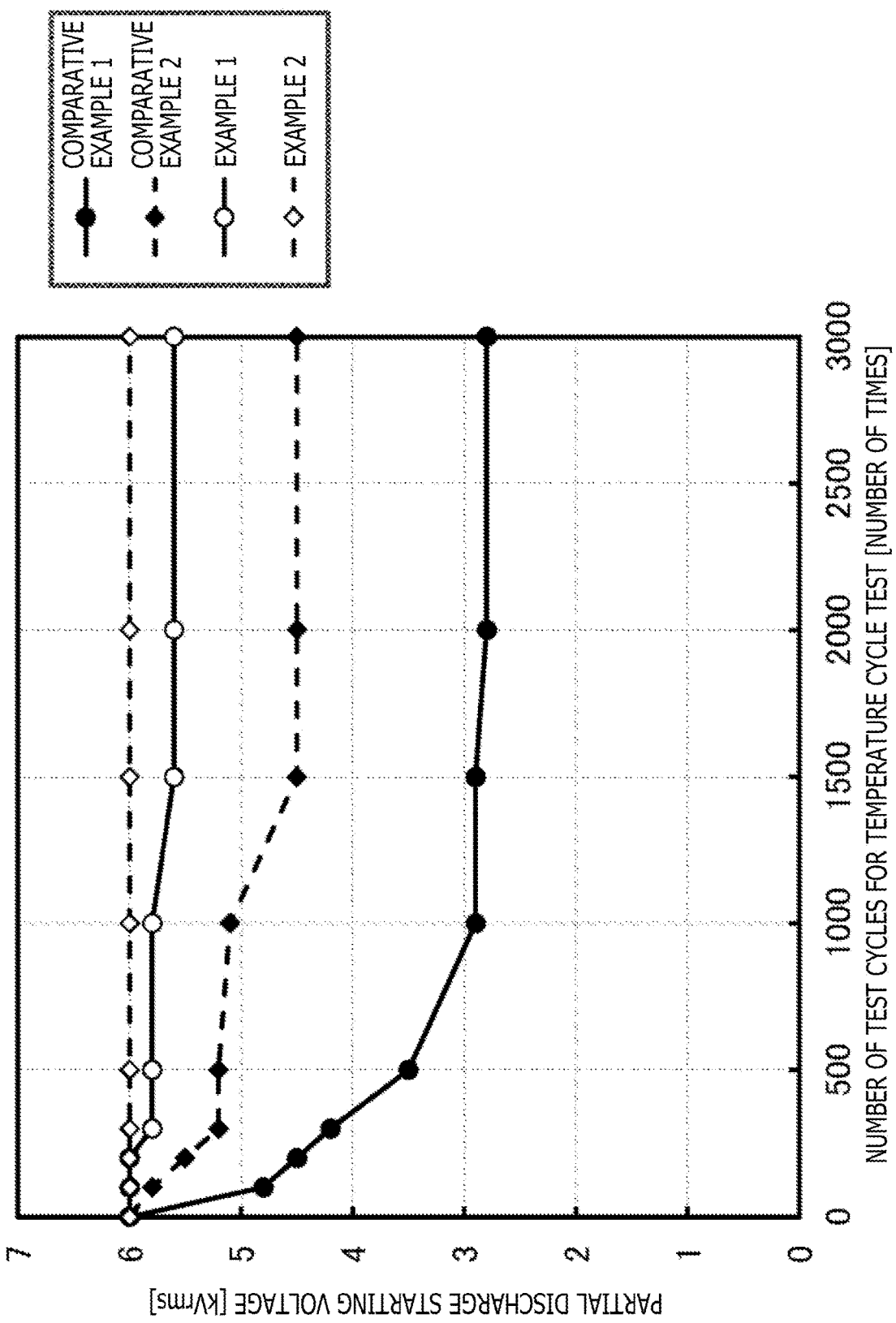

POWER SEMICONDUCTOR APPARATUS

TECHNICAL FIELD

The present invention pertains to a power semiconductor apparatus.

BACKGROUND ART

In recent years, environmental or resource problems on a global scale have been put into the limelight. In order to effectively use resources, promote energy saving, and suppress emission of greenhouse gases, there has been focus on high-efficiency power conversion apparatuses represented by inverter apparatuses which make use of switching of power semiconductor elements. Such a power conversion apparatus is widely applied and deployed to, for example, household electrical appliance such as refrigerators or air conditioners, but also to industrial machinery, hybrid electric vehicles (HEV), electric vehicles (EV), and devices that relate to railroad, power, and social infrastructure.

A power conversion apparatus is configured from many components, such as a power semiconductor apparatus (a power module) which incorporates a power semiconductor element such as an IGBT, a bus bar, a capacitor, an inductor, various sensors, and a control circuit. For safety and in order to reduce space for the installation area, a small power conversion apparatus with high reliability is required. This means it is important to have a small and highly-reliable power semiconductor apparatus which is the main component of the power conversion apparatus.

A power semiconductor apparatus configured by, for example, a power semiconductor element, a conductor section, heat dissipation material, and insulating material has a high amount of heat generated due to energization of the power semiconductor element, and thus it is necessary to efficiently cool the power semiconductor element to realize small size and high reliability. Accordingly, in recent years, a power semiconductor apparatus with a double-sided cooling structure in which a conductor section, an insulation plate, and a heat sink are attached to both sides of the power semiconductor element, and heat generated by the power semiconductor element is dissipated from both sides of the element has been developed. In such a power semiconductor apparatus with a double-sided cooling structure, while aiming to improve miniaturization or heat dissipation, in order make it so that electrical conduction does not occur when a high voltage is applied to the power semiconductor element, it is necessary to ensure high insulating properties between conductor sections disposed facing each other and sandwiching the power semiconductor element therebetween, and between a conductor section and a heat sink.

The technique described in the following Patent Document 1 is known as something that addresses the above-mentioned problem. Patent Document 1 describes a structure in which an intermediate conductor layer is, via an insulation layer, disposed between a conductor section, which is electrically connected to a power semiconductor element, and a heat dissipation section. By sharing the voltage between the conductor section and the heat dissipation section in accordance with this intermediate conductor layer, it is possible to ensure insulating properties even if the thickness of an insulating material is reduced.

PRIOR ART DOCUMENT

Patent Document

Patent Document 1: JP-2016-59147-A

SUMMARY OF INVENTION

Problem to be Solved by the Invention

With the technique of Patent Document 1, it is possible to ensure insulating properties between a conductor section and a heat sink, but no description is given regarding ensuring insulating properties between conductor sections.

Means for Solving the Problem

A power semiconductor apparatus according to the present invention is provided with a first conductor section connected to a direct-current terminal for transmitting direct-current power; a second conductor section connected to an alternating-current terminal for transmitting alternating-current power; a semiconductor element which is disposed between the first conductor section and the second conductor section and is for converting the direct-current power to the alternating-current power; and an interposition section disposed between the first conductor section and the second conductor section, in which the interposition section has a first conductor layer connected to the first conductor section, a second conductor layer connected to the second conductor section, and a plurality of insulation layers disposed between the first conductor layer and the second conductor layer, with one or a plurality of third conductor layers sandwiched between the plurality of insulation layers.

Advantages of the Invention

By virtue of the present invention, it is possible to provide a power semiconductor apparatus that ensures insulating properties between conductor sections, is small, and has superior reliability.

BRIEF DESCRIPTION OF THE DRAWINGS

FIG. 12 is a view that illustrates a result of measuring a partial discharge start voltage of each power semiconductor apparatus according to the comparative examples and the embodiments of the present invention.

MODES FOR CARRYING OUT THE INVENTION

Description of Comparative Example

Before describing the embodiments of the present invention, an example of the structure of a conventional power semiconductor apparatus is described below as a comparative example of the present invention.

Figure 1:
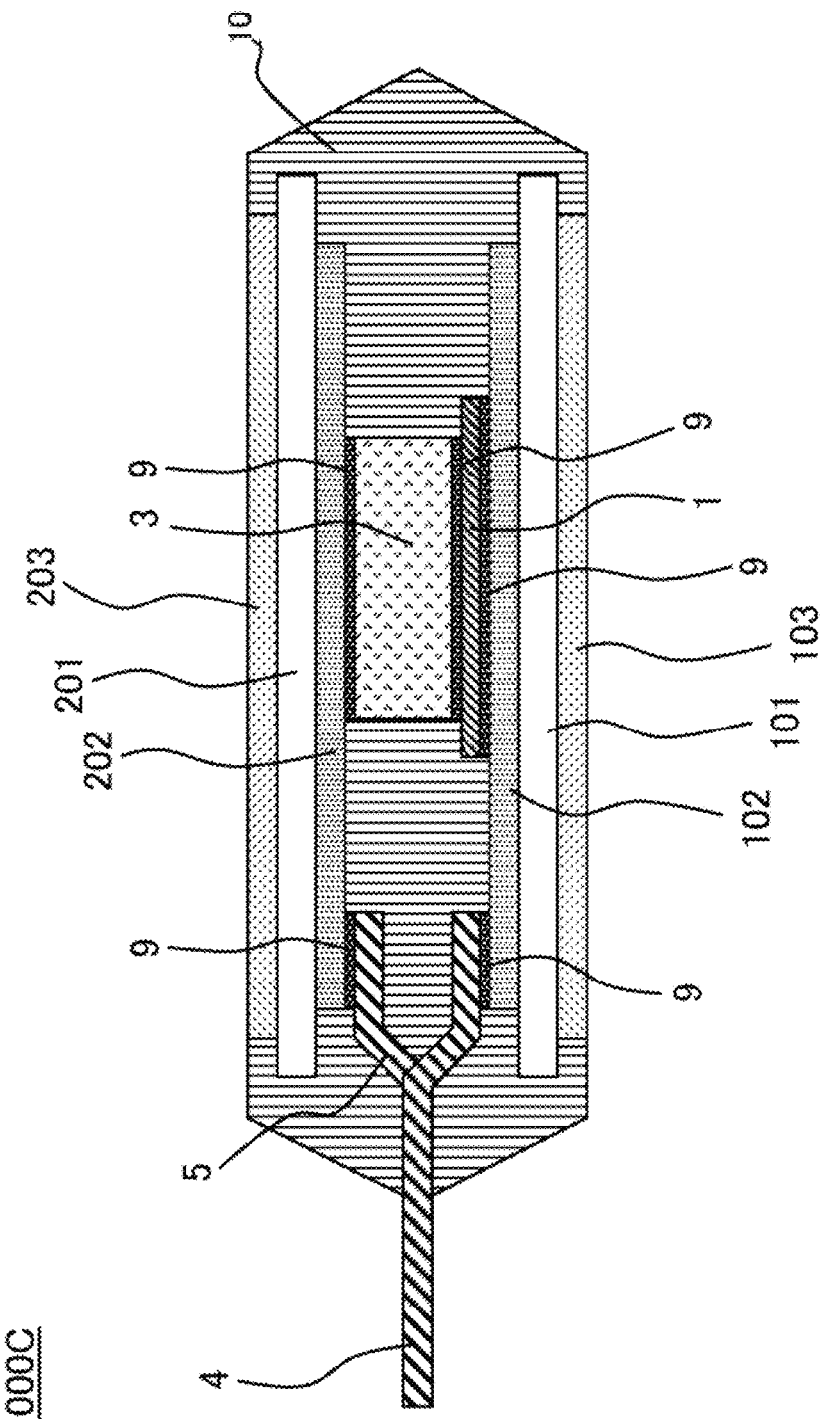
FIG. 1 is a cross-section view that illustrates the structure of a power semiconductor apparatus according to a first comparative example of the present invention.

FIG. 1 is a cross-section view that illustrates the structure of a power semiconductor apparatus 1000C according to a first comparative example of the present invention. The power semiconductor apparatus 1000C illustrated in FIG. 1 is provided with a semiconductor element 1, a spacer 3, a direct-current terminal 4, an alternating-current terminal 5, insulation members 101 and 201, a first conductor section 102, a second conductor section 202, and heat dissipation sections 103 and 203, and is configured by these being integrated by a sealing resin 10.

The direct-current terminal 4 is electrically connected to a direct-current bus bar (not illustrated) connected to a direct-current power supply, and is also joined to the first conductor section 102 by an electrically conductive joining member 9. The alternating-current terminal 5 is electrically connected to an alternating-current bus bar, not illustrated, connected to an alternating-current load such as an alternating-current motor, and is also joined to the second conductor section 202 by an electrically conductive joining member 9. The joining member 9 is configured by using solder, for example.

The semiconductor element 1 is an element which is capable of switching operation, such as an IGBT for example, and is disposed between the first conductor section 102 and the second conductor section 202. Direct-current power transmitted from the direct-current power supply by the direct-current terminal 4 is inputted to the semiconductor element 1 via the first conductor section 102. The semiconductor element 1 converts the direct-current power inputted from the direct-current terminal 4 via the first conductor section 102 to alternating-current power, and, via the spacer 3 which is disposed between the second conductor section 202 and the semiconductor element 1, outputs the converted alternating-current power to the second conductor section 202. The alternating-current power outputted from the semiconductor element 1 to the second conductor section 202 is outputted to the alternating-current terminal 5 via the second conductor section 202, and is transmitted to the alternating-current load by the alternating-current terminal 5. The semiconductor element 1 is joined by a joining member 9 to the first conductor section 102, and is joined by a joining member 9 to the spacer 3.

The spacer 3 is configured by using an electrically-conductive member such as copper, and transmits alternating-current power outputted from the semiconductor element 1 to the second conductor section 202. The spacer 3 is disposed so as to fill the space between the second conductor section 202 and the semiconductor element 1. As a result, in a process for manufacturing the power semiconductor apparatus 1000C, it is possible to appropriately adjust the position of the second conductor section 202. The spacer 3 and the second conductor section 202 are joined by a joining member 9.

The first conductor section 102 and the second conductor section 202 are disposed so as to be respectively thermally joined to the heat dissipation sections 103 and 203 via the insulation members 101 and 201. The heat dissipation sections 103 and 203 each expose, from the sealing resin 10, a surface opposite to the surface which is in contact with the insulation members 101 and 201, respectively. As a result, a double-sided cooling structure is realized in the power semiconductor apparatus 1000C, and it is possible to efficiently dissipate, from the heat dissipation sections 103 and 203, heat generated by energization of the semiconductor element 1.

In the power semiconductor apparatus 1000C having the double-sided cooling structure described above, typically the total coefficient of thermal expansion of three members, which are the spacer 3, the joining members 9, and the semiconductor element 1, is different to the coefficient of thermal expansion of the sealing resin 10. Accordingly, when the adhesive strength between the first conductor section 102 and the sealing resin 10 or between the second conductor section 202 and the sealing resin 10 is low, there is the possibility of separation occurring between the first conductor section 102 and the sealing resin 10 or between the second conductor section 202 and the sealing resin 10 in the power semiconductor apparatus 1000C due to temperature change arising due to repeatedly operating and halting the power semiconductor apparatus 1000C.

Figure 2:
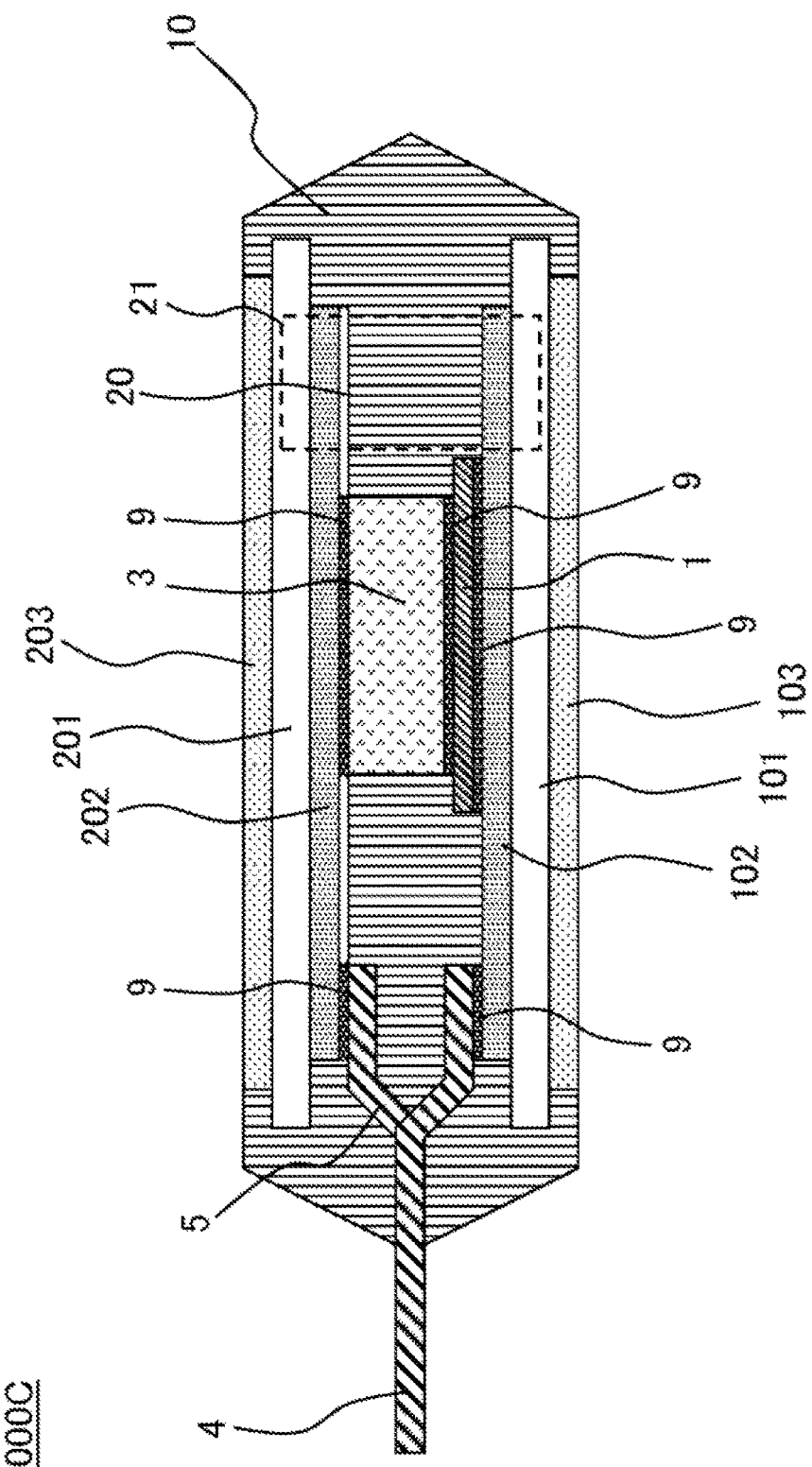
FIG. 2 is a view that illustrates an example of separation which occurs in a power semiconductor apparatus.

FIG. 2 is a view that illustrates an example of separation which occurs in the power semiconductor apparatus 1000C. In FIG. 2, a separation-section space 20, which is a space that arises due to separation, is present between the second conductor section 202 and the sealing resin 10.

In particular, in a case where the power semiconductor apparatus 1000C is used in transportation machines such as for railroads, automobiles, or aircraft, or in a case where the power semiconductor apparatus 1000C is used for power, the voltages used are comparatively high. Accordingly, it is necessary to make the height of the spacer 3 be large in order to ensure the withstand voltage between first conductor section 102 and the second conductor section 202 which are respectively electrically connected to the semiconductor element 1. Accordingly, there is a tendency in that it is easy for separation to occur between the first conductor section 102 and the sealing resin 10 or between the second conductor section 202 and the sealing resin 10.

Figure 3:
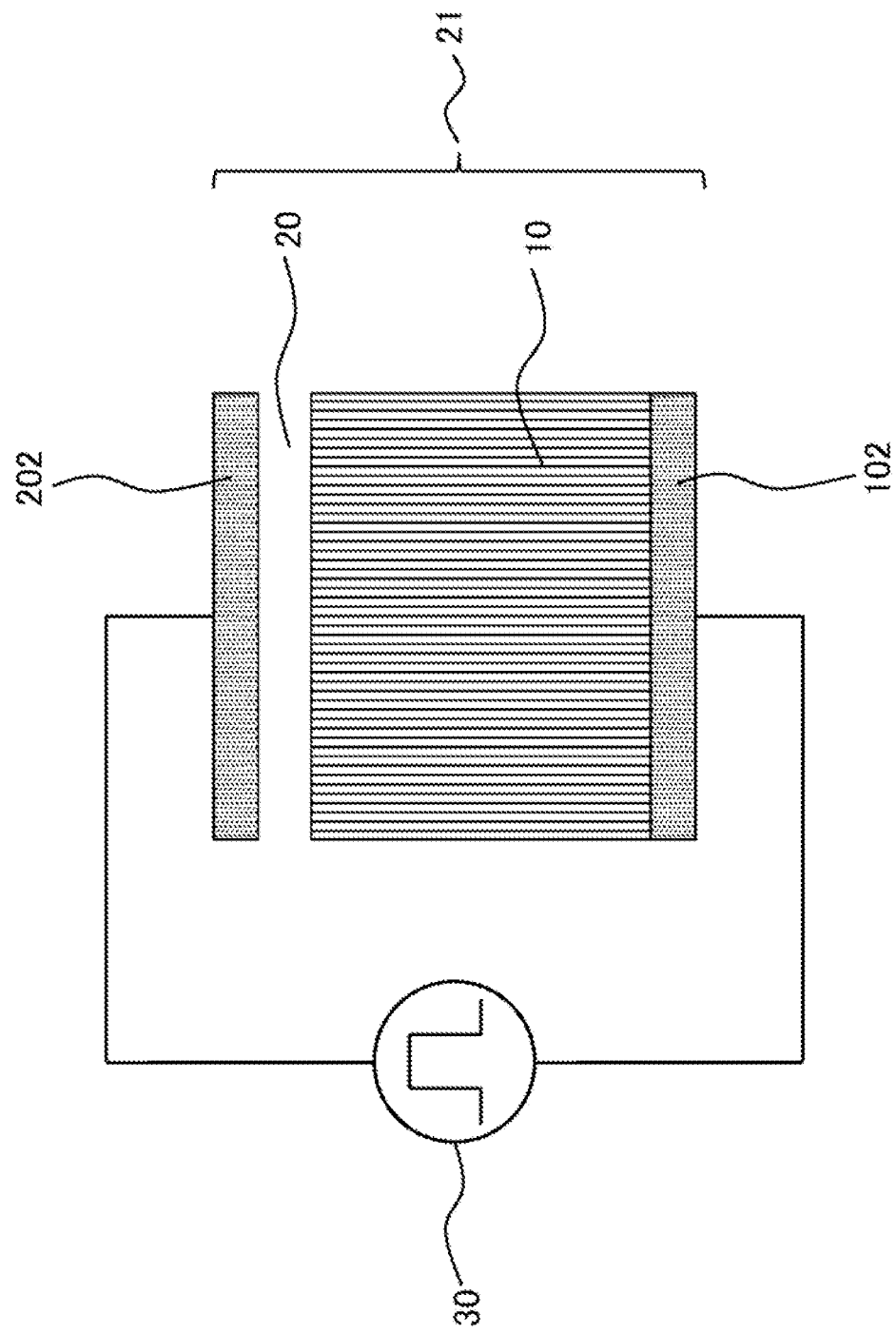
FIG. 3 is a schematic diagram of a separation section in a power semiconductor apparatus.

FIG. 3 is a schematic diagram of a separation section 21 in the power semiconductor apparatus 1000C. The separation section 21 of FIG. 2 includes the separation-section space 20 which has arisen due to separation between the second conductor section 202 and the sealing resin 10, and respective portions of the first conductor section 102 and the second conductor section 202 which face each other, sandwiching the separation-section space 20 and the sealing resin 10 therebetween. FIG. 3 illustrates an outline of the electrical characteristics of the separation section 21.

When the semiconductor element 1 performs switching operation, as indicated in FIG. 3, the semiconductor element 1 acts as a pulse generation source 30, and induces voltage change between the first conductor section 102 and the second conductor section 202. In the separation section 21, the sealing resin 10 and the separation-section space 20 are present between the first conductor section 102 and the second conductor section 202, as illustrated in FIG. 3. Accordingly, the voltage between the first conductor section 102 and the second conductor section 202 (referred to below as an inter-conductor voltage) is dividedly applied to the sealing resin 10 and the separation-section space 20.

Figure 4:
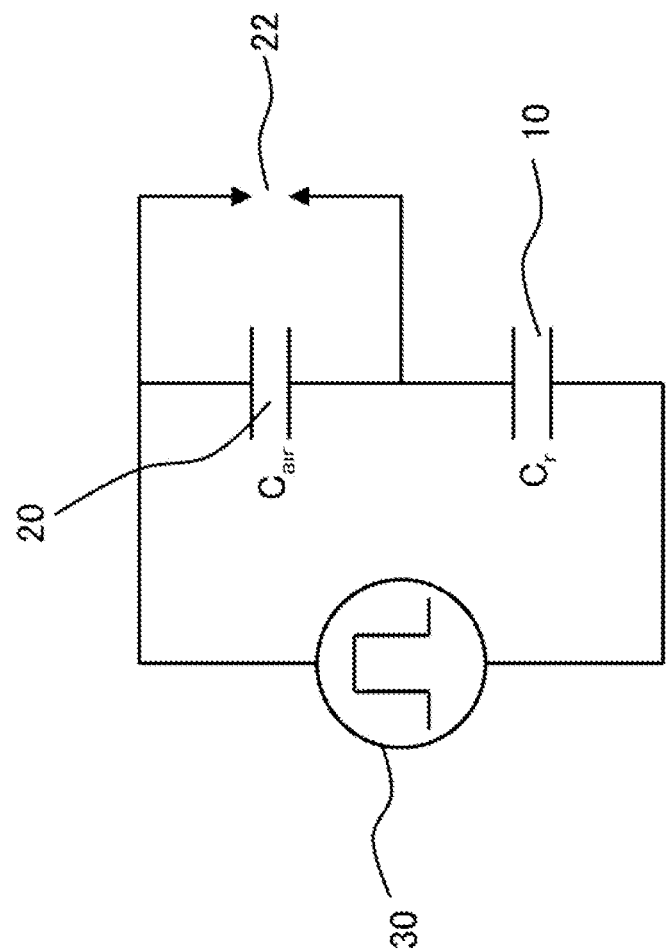
FIG. 4 is a view that illustrates an equivalent circuit of FIG. 3.

FIG. 4 is a view that illustrates an equivalent circuit of FIG. 3. As illustrated in FIG. 4, the voltage from the pulse generation source 30 is divided into a capacitive component Cr in accordance with the sealing resin 10 and a capacitive component Cair in accordance with the separation-section space 20.

Here, a discharge gap 22 connected in parallel to the capacitive component Cair is present in the separation-section space 20. The discharge gap 22 has a dielectric breakdown voltage according to the thickness of the separation-section space 20. In other words, the separation-section space 20 is filled with a gas (air). Typically, the dielectric breakdown strength of air is lower than the dielectric breakdown strength of the sealing resin 10. In addition, the relative permittivity of air is approximately 1, and the relative permittivity of the sealing resin 10 is typically approximately 3 to 6.

In a case where a thin separation-section space 20 widens between the second conductor section 202 and the sealing resin 10 as illustrated in FIG. 2, the electric field of the separation-section space 20 takes a value resulting from multiplying the electric field of the sealing resin 10 by the relative permittivity of the sealing resin 10. Accordingly, the voltage applied to the separation-section space 20 becomes larger than that applied to the sealing resin 10. When this voltage exceeds the dielectric breakdown voltage of the discharge gap 22, the dielectric breakdown of air occurs and a partial discharge occurs in the separation-section space 20. In other words, although a dielectric breakdown does not occur in the sealing resin 10 due to the inter-conductor voltage, a dielectric breakdown arises in the separation-section space 20 and thus a partial discharge occurs.

Even if a partial discharge occurs in the separation-section space 20, if the dielectric breakdown strength of the sealing resin 10 is high, there is a low possibility of reaching dielectric breakdown between the first conductor section 102 and the second conductor section 202 in a short period of time. However, when the power semiconductor apparatus 1000C is used over a long period of time, insulation deterioration gradually progresses in the sealing resin 10, and in the worst case there is the possibility of reaching dielectric breakdown between the first conductor section 102 and the second conductor section 202. In addition, even if dielectric breakdown is not reached, this progress leads to a reduction in insulation reliability. Accordingly, the occurrence of a partial discharge must be prevented as much as possible.

As above, in a power semiconductor apparatus 1000C with a double-sided cooling structure as with the power semiconductor apparatus 1000C according to the first comparative example of the present invention, it is important to prevent partial discharge in a usage environment and prevent insulation deterioration for an insulation section.

Figure 5:
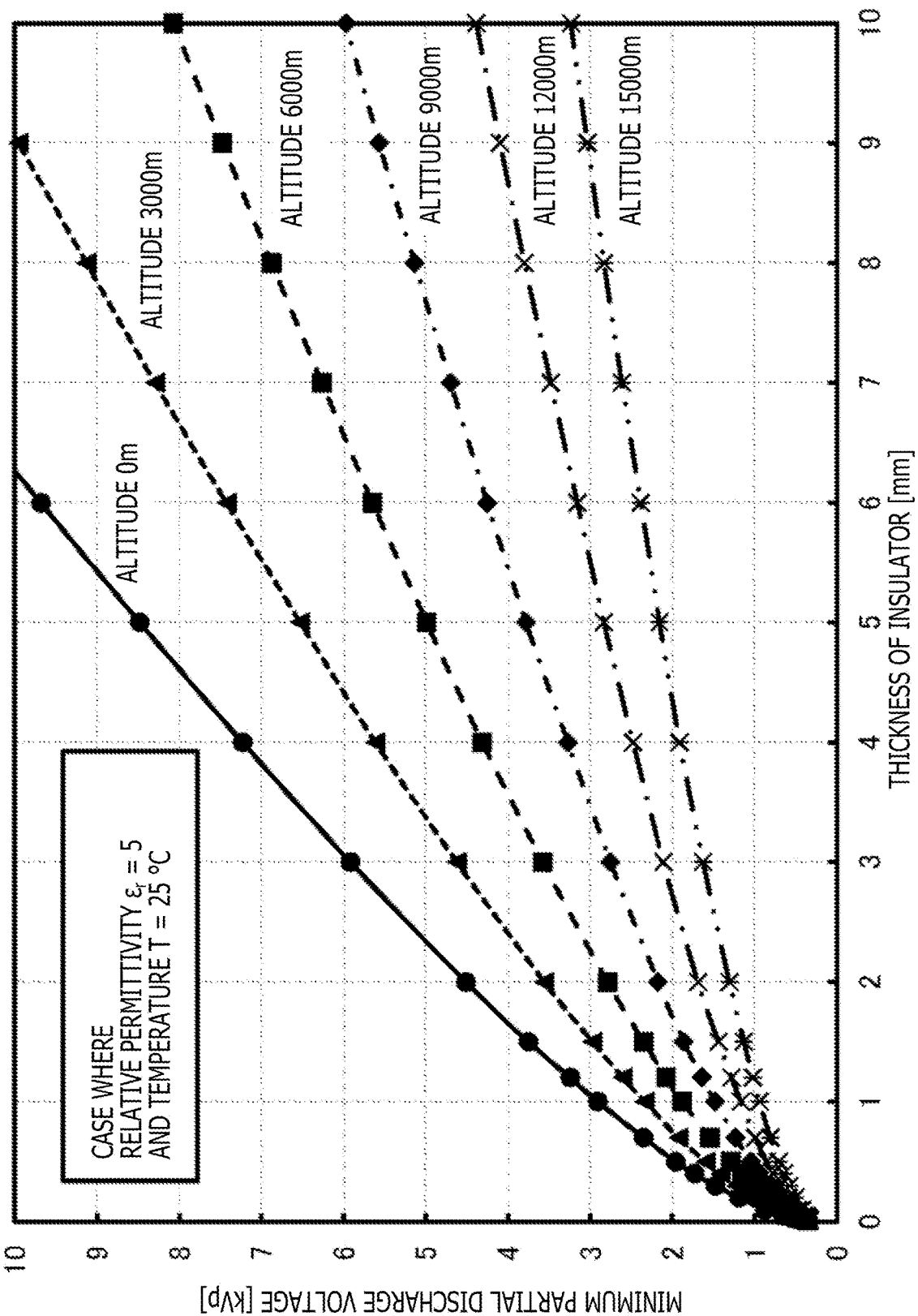
FIG. 5 is a view that illustrates an example of the relation between the thickness of an insulator and a minimum partial discharge voltage, in a separation section in a power semiconductor apparatus.

FIG. 5 is a view that illustrates an example of the relation between the thickness of the insulator in the separation section 21 in the power semiconductor apparatus 1000C and a minimum partial discharge voltage. Letting the relative permittivity εr of the sealing resin 10 be 5 and a temperature T be 25° C. as an example in a two-layer insulation configuration in which the sealing resin 10 which is an insulator and the separation-section space 20 are laminated between the first conductor section 102 and the second conductor section 202 as illustrated in FIG. 3, FIG. 5 illustrates results of obtaining through calculation of the relation between the thickness of the sealing resin 10 and the minimum partial discharge voltage. Note that the minimum partial discharge voltage in FIG. 5 is the minimum value of an inter-conductor voltage which is caused by a partial discharge in the separation-section space 20. In addition, altitude is taken as a parameter, and FIG. 5 illustrates the relation between the thickness of the sealing resin 10 and the minimum partial discharge voltage at barometric pressures corresponding to various altitudes.

According to FIG. 5, it is understood that the minimum partial discharge voltage gets lower, the thinner the sealing resin 10 is. In addition, it is understood that, even if the thickness of the sealing resin 10 is the same, the minimum partial discharge voltage gets lower, the higher the altitude, in other words, the lower the barometric pressure.

For an aircraft, which together with automobiles or railroads is a transportation machine, at present thrust is produced by a jet engine which uses fossil fuel. The situation for aircraft is that they are inferior in efficiency to other transportation machines when viewed from a perspective of effective use of resources. Assuming broader demand for air transport in the future, greater emission of greenhouse gases is forecast if there are more aircraft that use jet engines for thrust in the same way. Accordingly, electrification is desired for aircraft as well, similarly to with other transportation machines.

In order to electrify an aircraft, a small-size large-capacity battery or a small-size high-output electric motor and a power conversion apparatus are necessary. In addition, in a power conversion apparatus used at a high-altitude location as with an aircraft, in the case where a separation-section space 20 as illustrated in FIG. 2 occurs, it is necessary to consider that a decrease in a partial discharge start voltage arises according to altitude, as illustrated in FIG. 5.

Figure 6:
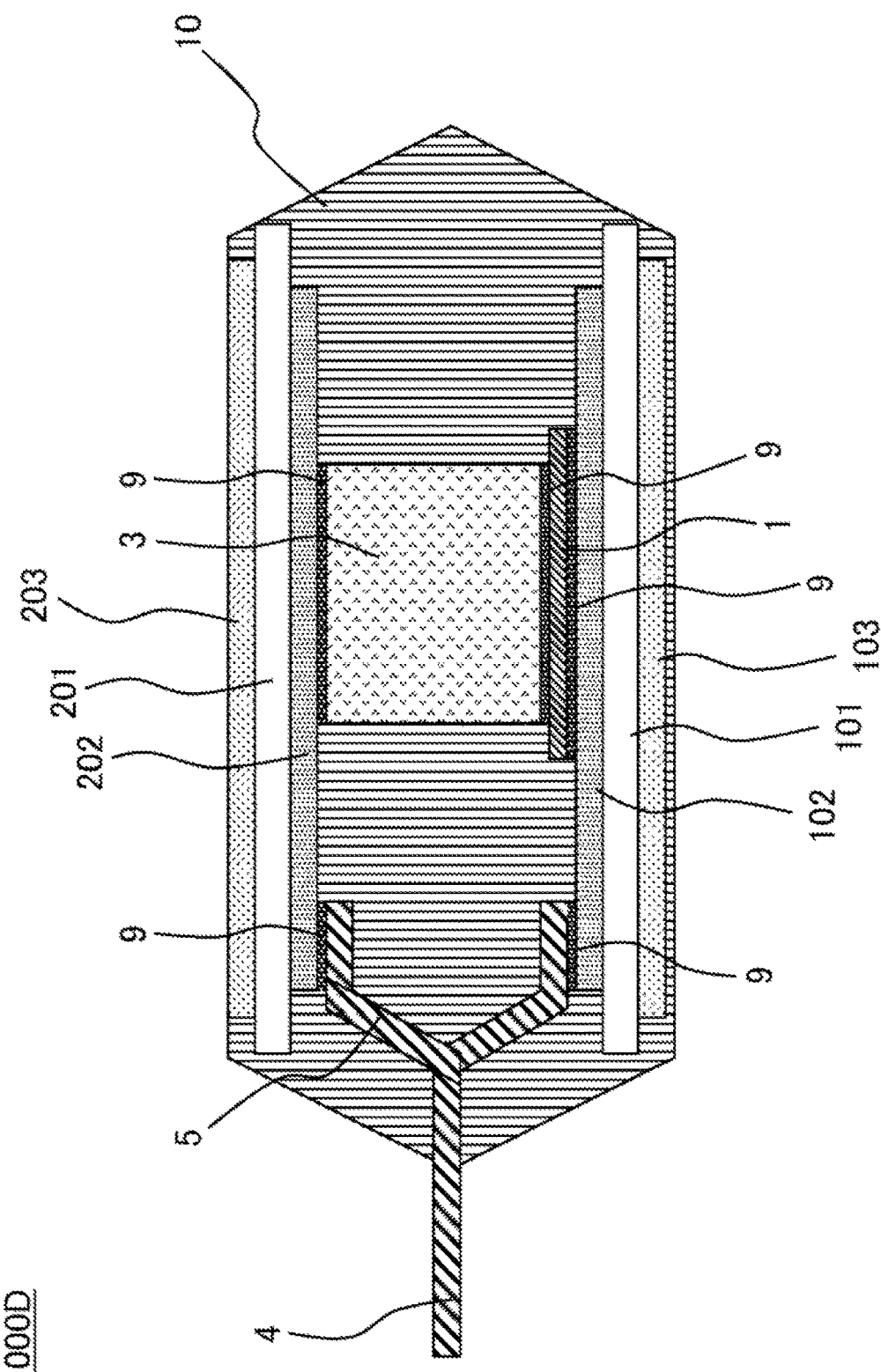
FIG. 6 is a cross-section view that illustrates the structure of a power semiconductor apparatus according to a second comparative example of the present invention.

With reference to FIG. 6, description is given below for an example of a method for compensating for the decrease in the partial discharge start voltage at high altitudes as described above. FIG. 6 is a cross-section view that illustrates the structure of a power semiconductor apparatus 1000D according to a second comparative example of the present invention. In comparison to the power semiconductor apparatus 1000C according to the first comparative example illustrated in FIG. 1, with the power semiconductor apparatus 1000D illustrated in FIG. 6, the height of the spacer 3 is made to be higher, and the insulation distance (thickness of the insulator) between the first conductor section 102 and the second conductor section 202 is made to be larger.

When the power semiconductor apparatus 1000D of FIG. 6 is employed, it is possible to increase the minimum partial discharge voltage in a case where separation occurs between the first conductor section 102 and the sealing resin 10 or between the second conductor section 202 and the sealing resin 10. However, as understood from FIG. 5, at high altitudes, the greater the thickness of an insulator, the more a rise in the minimum partial discharge voltage with respect to the thickness of the insulator trends towards saturation, and thus the more that an effect which is obtained reduces. In addition, since increasing the height of the spacer 3 also increases the size of the power semiconductor apparatus 1000D in addition to increasing the thermal resistance, this goes against requests for smaller size or improved heat dissipation which is required overall for the power semiconductor apparatus.

The present invention is made in light of the abovementioned problem, and has an objective of providing a small and highly-reliable power semiconductor apparatus that can suppress the occurrence of a partial discharge even in a case where a gap has arisen due to separation of an insulator disposed between conductors. In each of the following embodiments, description is given regarding examples of the structure of a power semiconductor apparatus according to the present invention.

First Embodiment

Figure 7:
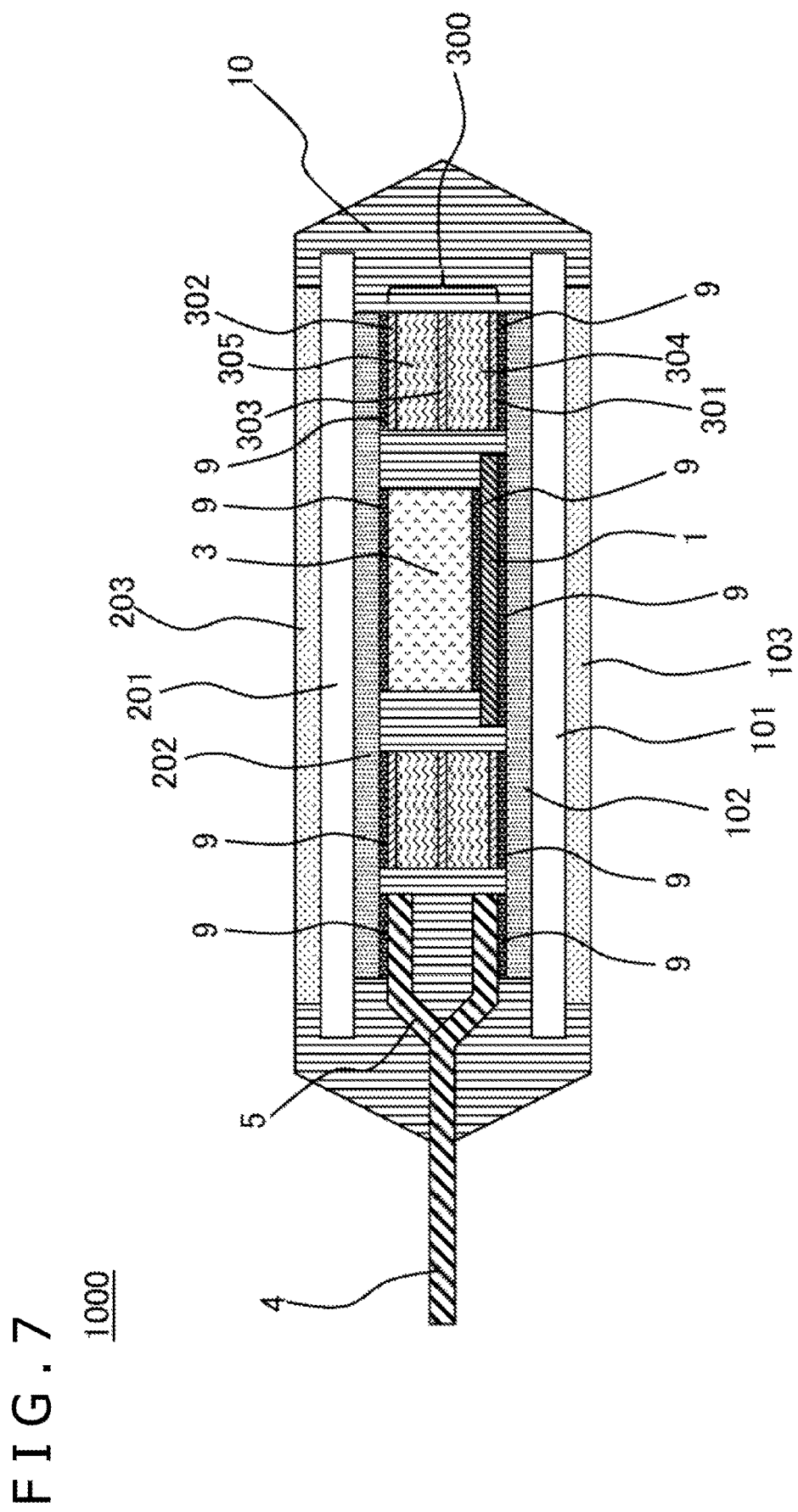
FIG. 7 is a cross-section view that illustrates the structure of a power semiconductor apparatus according to a first embodiment of the present invention.

FIG. 7 is a cross-section view that illustrates the structure of a power semiconductor apparatus 1000 according to a first embodiment of the present invention. In addition to the semiconductor element 1, spacer 3, direct-current terminal 4, alternating-current terminal 5, insulation members 101 and 201, first conductor section 102, second conductor section 202, and heat dissipation sections 103 and 203 in the power semiconductor apparatus 1000C of FIG. 1 described by the first comparative example, the power semiconductor apparatus 1000C illustrated in FIG. 7 also has an interposition section 300. The power semiconductor apparatus 1000 according to the present embodiment is configured by these being integrated by the sealing resin 10.

The interposition section 300 is disposed between the first conductor section 102 and the second conductor section 202. Note that, the cross-section view of FIG. 7 illustrates a situation in which the interposition section 300 is disposed on the left and right of the semiconductor element 1 and the spacer 3, sandwiching the semiconductor element 1 and the spacer 3 therebetween. However, as described later with reference to FIG. 10, in practice the interposition section 300 is disposed so as to surround the perimeter of the semiconductor element 1 in a plane orthogonal to the direction in which the first conductor section 102 and the second conductor section 202 overlap, in other words, the up/down direction in FIG. 7.

The interposition section 300 has a first conductor layer 301 which is joined to the first conductor section 102 by a joining member 9, a second conductor layer 302 which is joined to the second conductor section 202 by a joining member 9, a third conductor layer 303 disposed between the first conductor layer 301 and the second conductor layer 302, a first insulation layer 304, and a second insulation layer 305. In the present embodiment, the third conductor layer 303 is made up of a single layer, and two insulation layers (the first insulation layer 304 and the second insulation layer 305) which sandwich the third conductor layer 303 therebetween are disposed between the first conductor layer 301 and the second conductor layer 302. The first insulation layer 304 and the second insulation layer 305 are made from a resin, for example.

In the power semiconductor apparatus 1000 according to the present embodiment, an inter-conductor voltage applied between the first conductor section 102 and the second conductor section 202 is, in the interposition section 300, divided into a capacitive component for the first insulation layer 304 disposed between the first conductor layer 301 and the third conductor layer 303, and a capacitive component for the second insulation layer 305 disposed between the second conductor layer 302 and the third conductor layer 303. Accordingly, in the case where a separation-section space 20 has arisen between the first conductor section 102 and the sealing resin 10 or between the second conductor section 202 and the sealing resin 10 due to the separation described with FIG. 2, it is possible to reduce the voltage applied to the separation-section space 20. As a result, since it is possible to increase the minimum partial discharge voltage in comparison to the first and second comparative examples, it is possible to suppress the occurrence of a partial discharge.

Second Embodiment

Figure 8:
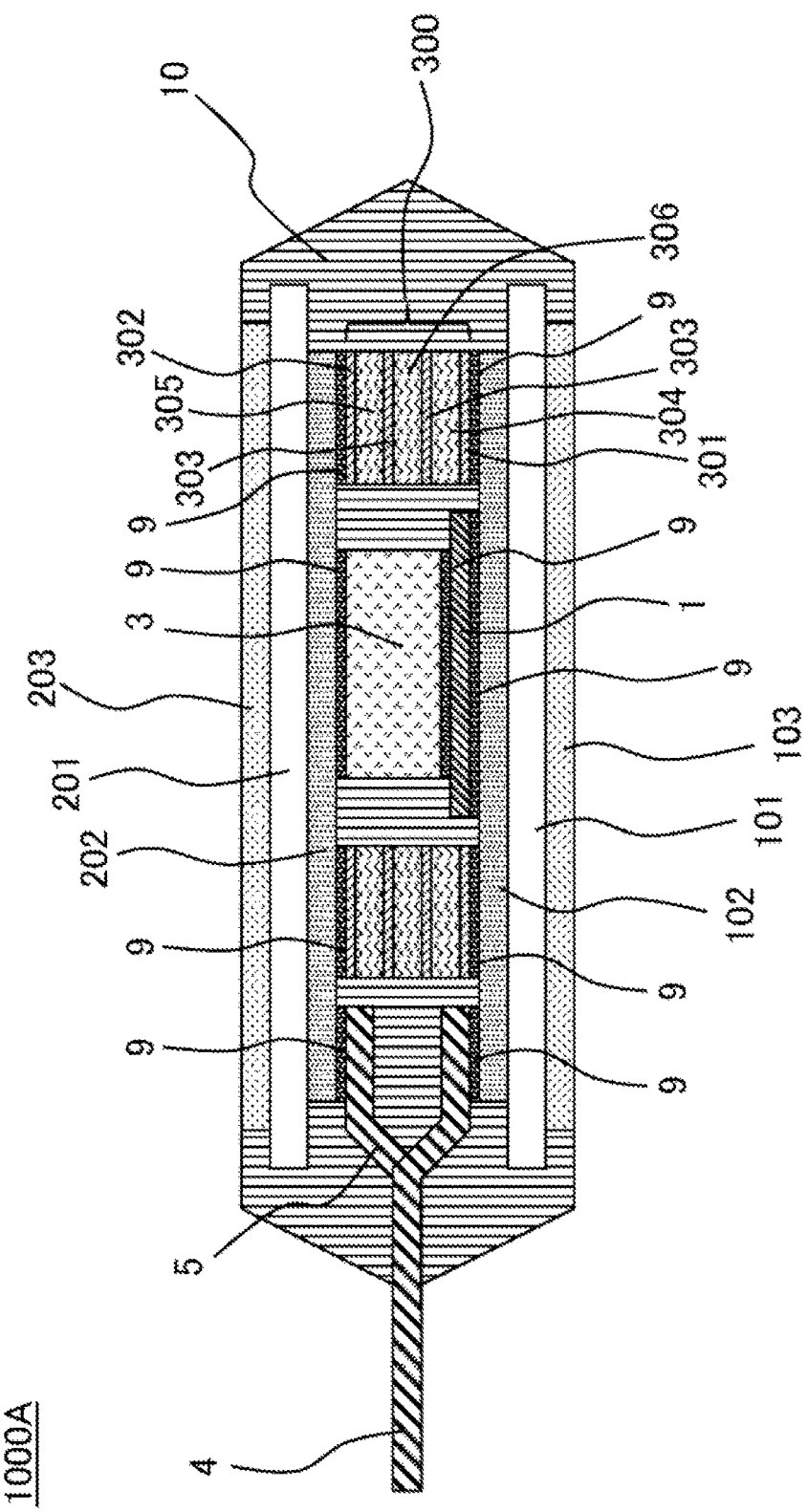
FIG. 8 is a cross-section view that illustrates the structure of a power semiconductor apparatus according to a second embodiment of the present invention.

FIG. 8 is a cross-section view that illustrates the structure of a power semiconductor apparatus 1000A according to a second embodiment of the present invention. For the power semiconductor apparatus 1000A illustrated in FIG. 8, the structure of the interposition section 300 differs in comparison to the power semiconductor apparatus 1000 of FIG. 7 described in the first embodiment. Specifically, the interposition section 300 in the present embodiment has a first conductor layer 301 which is joined to the first conductor section 102 by a joining member 9, a second conductor layer 302 which is joined to the second conductor section 202 by a joining member 9, a third conductor layer 303 disposed between the first conductor layer 301 and the second conductor layer 302, a first insulation layer 304, a second insulation layer 305, and a third insulation layer 306. In the present embodiment, the third conductor layer 303 is made up of two layers, and three insulation layers (the first insulation layer 304, the second insulation layer 305, and the third insulation layer 306) which sandwich the two layers of the third conductor layer 303 therebetween are disposed between the first conductor layer 301 and the second conductor layer 302. Here, the third insulation layer 306 is disposed between the two layers of the third conductor layer 303. The first insulation layer 304, the second insulation layer 305, and the third insulation layer 306 are made up from a resin, for example.

In the power semiconductor apparatus 1000A according to the present embodiment, an inter-conductor voltage applied between the first conductor section 102 and the second conductor section 202 is, in the interposition section 300, divided into a capacitive component for the first insulation layer 304 disposed between the first conductor layer 301 and the lower third conductor layer 303, a capacitive component for the third insulation layer 306 disposed between the two third conductor layers 303, and a capacitive component for the second insulation layer 305 disposed between the second conductor layer 302 and the upper third conductor layer 303. Accordingly, similarly to the first embodiment, in a case where a separation-section space 20 has arisen between the first conductor section 102 and the sealing resin 10 or between the second conductor section 202 and the sealing resin 10 due to the separation described with FIG. 2, it is possible to reduce the voltage applied to the separation-section space 20. As a result, since it is possible to increase the minimum partial discharge voltage in comparison to the first and second comparative examples, it is possible to suppress the occurrence of a partial discharge. Furthermore, since it is possible to increase the minimum partial discharge voltage even in comparison to the first embodiment, it is possible to further suppress the occurrence of a partial discharge.

Third Embodiment

Figure 9:
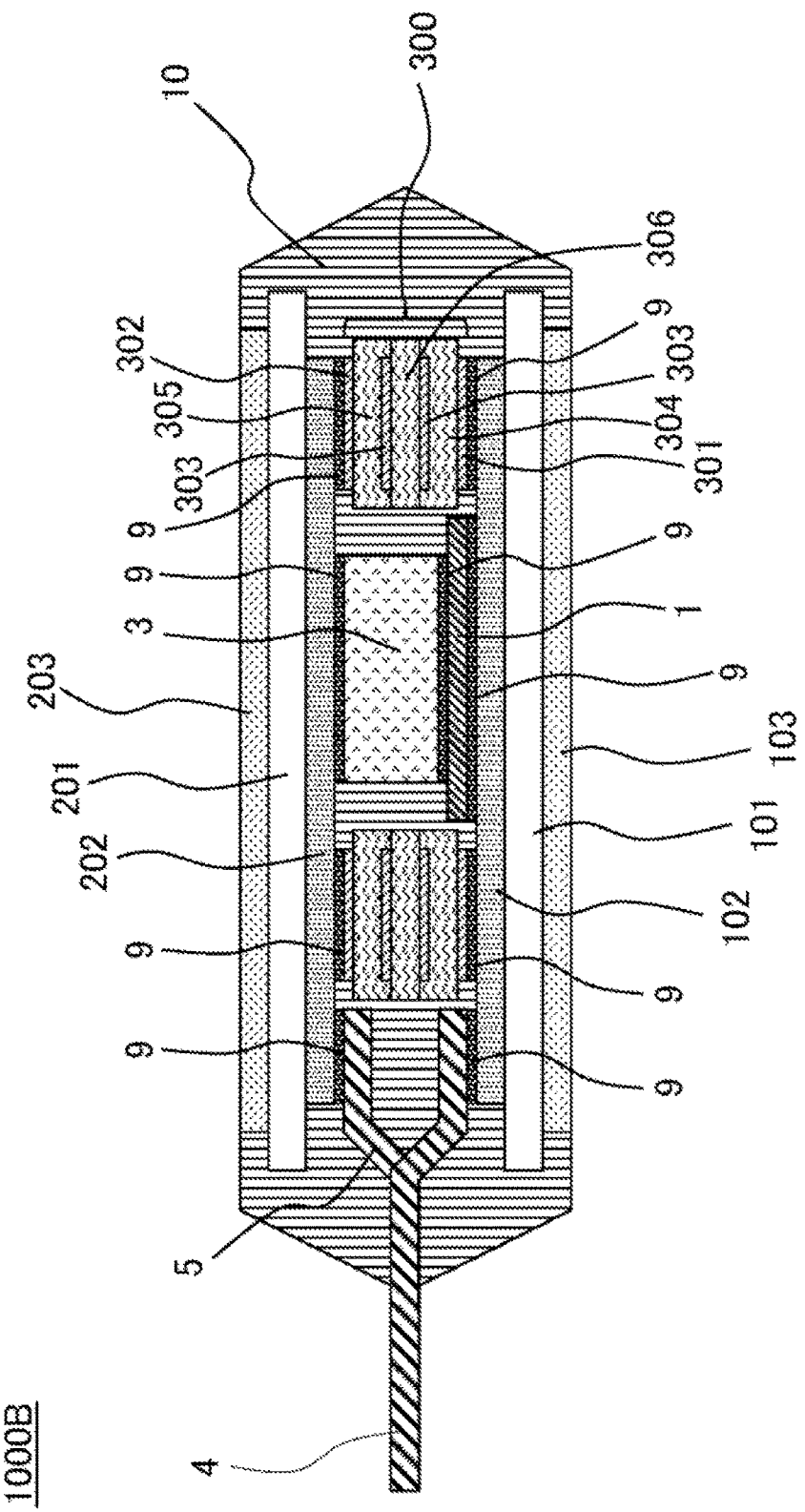
FIG. 9 is a cross-section view that illustrates the structure of a power semiconductor apparatus according to a third embodiment of the present invention.

FIG. 9 is a cross-section view that illustrates the structure of a power semiconductor apparatus 1000B according to a third embodiment of the present invention. For the power semiconductor apparatus 1000B illustrated in FIG. 9, the structure of the interposition section 300 differs in comparison to the power semiconductor apparatus 1000A of FIG. 8 described in the second embodiment. Specifically, for the interposition section 300 in the present embodiment, the three insulation layers (the first insulation layer 304, the second insulation layer 305, and the third insulation layer 306) disposed between the first conductor layer 301 and the second conductor layer 302 have structures which are wider than those of the first conductor layer 301, the second conductor layer 302, and the third conductor layer 303. Other points are similar to those in the second embodiment.

The power semiconductor apparatus 1000B according to the present embodiment can achieve an effect similar to that of the second embodiment.

(Method of Producing a Power Semiconductor Apparatus)

Next, with reference to FIGS. 10 and 11, description is given below regarding an example of a method of producing the power semiconductor apparatuses 1000, 1000A, and 1000B according to the respective embodiments described above.

Firstly, two ceramic insulation circuit substrates resulting from forming a copper conductor layer (layer thickness 0.4 mm) on both sides of an AlN ceramic insulation board (board thickness 0.635 mm) are prepared. These ceramic insulation circuit substrates are used as the insulation members 101 and 201 in each power semiconductor apparatus. In addition, one conductor layer in each of these ceramic insulation circuit substrates is subject to removal by etching, in advance, of unnecessary portions of the conductor layer which is to become an insulation section between circuit patterns. These conductor layers are electrically joined to the semiconductor element 1 to thereby form the first conductor section 102 and the second conductor section 202. The other respective conductor layers form the heat dissipation sections 103 and 203.

Next, the interposition section 300 is formed using a printed circuit board. Specifically, in the case of the power semiconductor apparatus 1000 according to the first embodiment, copper foil with a thickness of 35 μm is used as each of the first conductor layer 301, the second conductor layer 302, and the third conductor layer 303. In addition, a glass cloth epoxy resin prepreg with a thickness of 1 mm is used as each of the first insulation layer 304 and the second insulation layer 305. The first conductor layer 301, the first insulation layer 304, the third conductor layer 303, the second insulation layer 305, and the second conductor layer 302 are laminated in this order, and subjected to molding by a vacuum press to produce the interposition section 300.

Meanwhile, in the case of the power semiconductor apparatus 1000A according to the second embodiment and in the case of the power semiconductor apparatus 1000B according to the third embodiment, copper foil with a thickness of 35 μm is used as each of the first conductor layer 301, the second conductor layer 302, and the third conductor layer 303. In addition, a glass cloth epoxy resin prepreg with a thickness of 0.65 mm is used as each of the first insulation layer 304, the second insulation layer 305, and the third insulation layer 306. The first conductor layer 301, the first insulation layer 304, the third conductor layer 303, the third insulation layer 306, the third conductor layer 303, the second insulation layer 305, and the second conductor layer 302 are laminated in this order, and subjected to molding by a vacuum press to produce the interposition section 300.

Figure 10:
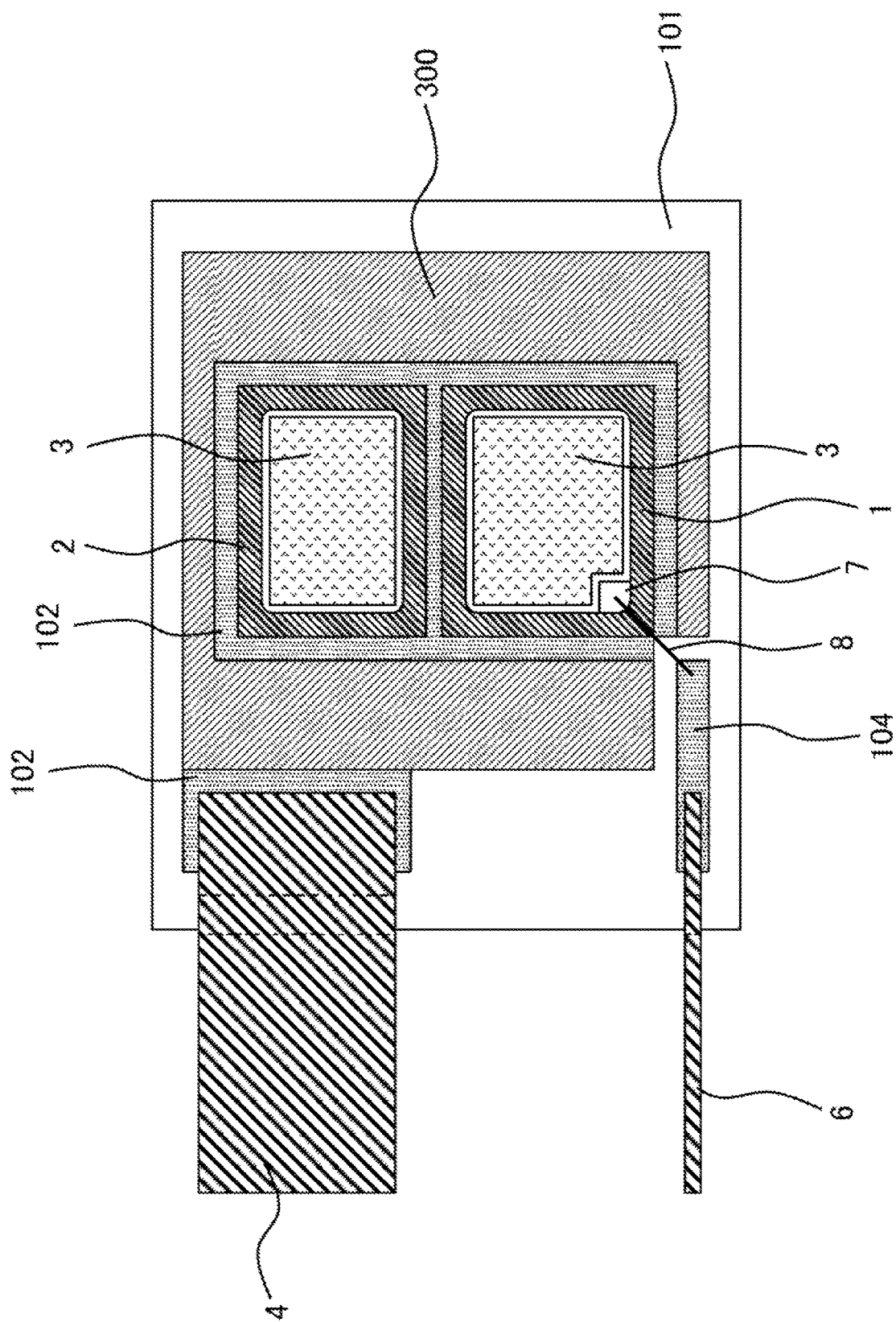
FIG. 10 is a view for describing an example of a method of producing a power semiconductor apparatus.

Next, as illustrated in FIG. 10, semiconductor elements 1 and 2, the interposition section 300, and the direct-current terminal 4 are respectively disposed at a predetermined position on one conductor layer (the first conductor section 102) of a first ceramic insulation circuit substrate, and joined via joining members 9. Note that the semiconductor element 1 is an IGBT for example as described above, and the semiconductor element 2 is a diode for example. In addition, the interposition section 300 is disposed so as to surround the perimeters of the semiconductor elements 1 and 2, and the direct-current terminal 4 is disposed on the outside of the interposition section 300. Furthermore, a portion of the first conductor section 102, as a gate connection conductor section 104, is insulated from other portions. A control terminal 6 for connecting to a gate electrode 7 of the semiconductor element 1 is disposed on the gate connection conductor section 104, and joined via a joining member 9.

Once the semiconductor elements 1 and 2, the interposition section 300, the direct-current terminal 4, and the control terminal 6 are joined to the first conductor section 102 or the gate connection conductor section 104 at respective predetermined dispositions as described above, spacers 3 are respectively disposed on the semiconductor elements 1 and 2, and joined via joining members 9. Furthermore, the gate electrode 7 of the semiconductor element 1 and the gate connection conductor section 104 are electrically connected to each other by a metal wire 8.

Figure 11:
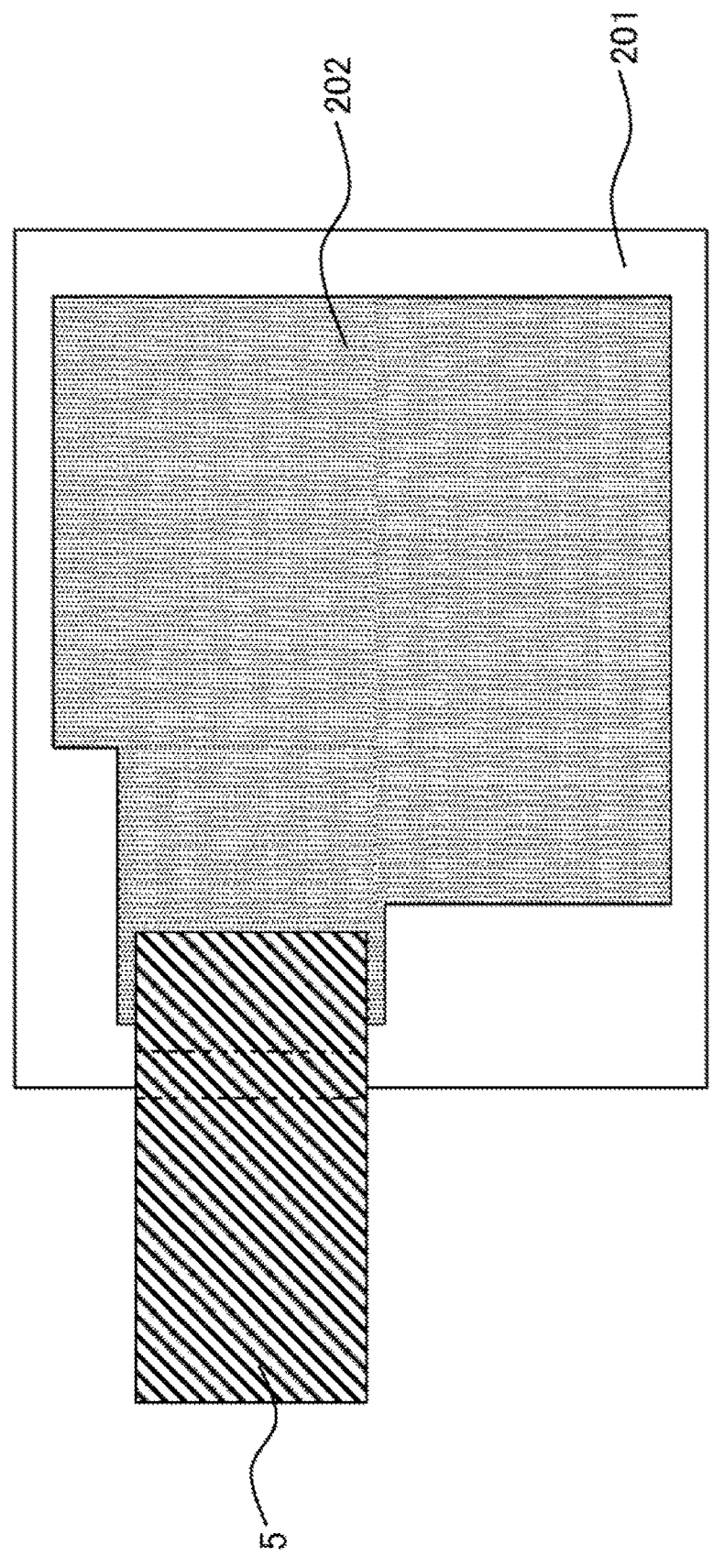
FIG. 11 is a view for describing an example of a method of producing a power semiconductor apparatus.

In addition, as illustrated in FIG. 11, the alternating-current terminal 5 is disposed at a predetermined position on the other conductor layer (the second conductor section 202) of the second ceramic insulation circuit substrate, and joined via a joining member 9.

As described above, once necessary components are respectively disposed on the two ceramic insulation circuit substrates, the first conductor section 102 and the second conductor section 202 are made to face each other and overlapped. The interposition section 300 and the spacer 3 are respectively joined via joining members 9 to predetermined positions on the second conductor section 202. The distance between the first conductor section 102 and the second conductor section 202 in this state is approximately 2.2 mm in each of the embodiments.

Subsequently, each component is subject to insulation sealing by molding by the sealing resin 10 between the two ceramic insulation circuit substrates. As a result, the power semiconductor apparatuses 1000, 1000A, and 1000B of respective embodiments are completed.

Note that, except for steps relating to the interposition section 300, it is possible to produce the power semiconductor apparatuses 1000C and 1000D according to the first and second comparative examples described above by a similar production method as described above. In this case, the distance between the first conductor section 102 and the second conductor section 202 in the power semiconductor apparatus 1000C according to the first comparative example is approximately 2.2 mm, for example, which is similar to that in each of the first through third embodiments. In contrast, the distance between the first conductor section 102 and the second conductor section 202 in the power semiconductor apparatus 1000D according to the second comparative example is approximately 4.0 mm, for example.

(Power Semiconductor Apparatus Testing)

Next, description is given regarding testing that uses a power semiconductor apparatus according to the present invention. Description is given below for a result of, in order to verify effects regarding the insulation reliability of a power semiconductor apparatus according to the present invention, performing respective temperature cycle tests and performing a partial discharge test each predetermined test cycle, using the power semiconductor apparatuses 1000 and 1000A respectively described in the first and second embodiments and the power semiconductor apparatuses 1000C and 1000D respectively described in the first and second comparative examples.

Note that the purpose of the present invention as described above is to prevent the occurrence of a partial discharge in a case where separation has occurred between the first conductor section 102 and the sealing resin 10 or between the second conductor section 202 and the sealing resin 10. Accordingly, in the present test, a sample which uses a glass plate in place of the semiconductor element 1 was produced for each of the power semiconductor apparatuses 1000, 1000A, 1000C, and 1000D. By performing a partial discharge test using these samples, it was possible to confirm the situation of the occurrence of a partial discharge between the first conductor section 102 and the second conductor section 202. This is because, although it is necessary to apply an alternating-current voltage as the inter-conductor voltage in order to confirm the situation of the occurrence of a partial discharge between the first conductor section 102 and the second conductor section 202, when the semiconductor element 1 is mounted, current will flow to the semiconductor element 1 due to the application of the inter-conductor voltage, and the partial discharge will cease to occur.

In the present test, a temperature cycle test was performed with respect to each sample respectively corresponding to the power semiconductor apparatuses 1000, 1000A, 1000C, and 1000D, a partial discharge measuring apparatus is used every predetermined test cycle in order to measure the voltage (partial discharge start voltage) at which a partial discharge occurs between the first conductor section 102 and the second conductor section 202 when the alternating-current voltage applied between the direct-current terminal 4 and the alternating-current terminal 5 is caused to gradually rise from 0 V. Here, a threshold for determining that a partial discharge has occurred is set to 10 pC. Note that, when measuring the partial discharge start voltage, after a sample is taken out from a temperature cycle test tank, the sample is put into a vacuum chamber and held at 0.2 atmospheres for one week, subsequently taken out from the vacuum chamber, and an alternating-current voltage was applied between the direct-current terminal 4 and the alternating-current terminal 5. In this manner, performing the measurement of the partial discharge start voltage after holding the sample at 0.2 atmospheres for one week is in order to, in a case where a separation-section space 20 has arisen between the first conductor section 102 and the sealing resin 10 or between the second conductor section 202 and the sealing resin 10 due to the temperature cycle test, make it easier for a partial discharge to occur in the separation-section space 20.

FIG. 12 is a view that illustrates a result of measuring a partial discharge start voltage of each power semiconductor apparatus according to the comparative examples and the embodiments of the present invention. FIG. 12 illustrates the relation between the number of test cycles for each sample when a temperature cycle test is performed over the range of −40° C. to 125° C., and the result of measuring the partial discharge start voltage. Note that, in the measurement of the partial discharge start voltage, the maximum value of the alternating-current voltage applied between the direct-current terminal 4 and the alternating-current terminal 5 was set as 6 kVrms. Even in the case where a partial discharge did not occur even at 6 kVrms, plotting was performed in FIG. 12 with the partial discharge start voltage set to 6 kVrms.

As illustrated in FIG. 12, before the start of the temperature cycle test, it was confirmed that a partial discharge did not occur even at the maximum applied voltage of 6 kVrms for all of the sample correspond to the power semiconductor apparatus 1000 according to the first embodiment (example 1), the sample corresponding to the power semiconductor apparatus 1000A according to the second embodiment (example 2), the sample corresponding to the power semiconductor apparatus 1000C of the first comparative example (comparative example 1), and the sample corresponding to the power semiconductor apparatus 1000D of the second comparative example (comparative example 2).

In addition, when 100 cycles of the temperature cycle test had elapsed, it was confirmed that a partial discharge occurred in the comparative example 1 at 4.8 kVrms and occurred in the comparative example 2 at 5.8 kVrms. Subsequently, every time a number of cycles elapsed, the partial discharge voltage gradually decreased in both the comparative example 1 and the comparative example 2. After 3000 cycles had elapsed, which was when the temperature cycle test ended, it was confirmed that a partial discharge occurred in the comparative example 1 at 2.8 kVrms and occurred in the comparative example 2 at 4.5 kVrms. Here, as described above, in the power semiconductor apparatus 1000C corresponding to the comparative example 1, the distance between the first conductor section 102 and the second conductor section 202 was approximately 2.2 mm, and, in the power semiconductor apparatus 1000D corresponding to the comparative example 2, the distance between the first conductor section 102 and the second conductor section 202 was approximately 4.0 mm. Accordingly, it is understood that the comparative example 2, which has a larger insulation distance (thickness of the sealing resin 10), has a higher partial discharge start voltage.

Meanwhile, in the case of example 1, it was confirmed that a partial discharge occurred at 5.8 kVrms when 300 cycles had elapsed, and a partial discharge occurred at 5.6 kVrms when 3000 cycles had elapsed which is when the temperature cycle test ended. In addition, in the case of example 2, the occurrence of a partial discharge could not be found throughout the temperature cycle test. Here, as described above, in the power semiconductor apparatus 1000 corresponding to example 1 and the power semiconductor apparatus 1000A corresponding to example 2, the distance between the first conductor section 102 and the second conductor section 202 was approximately 2.2 mm which is the same as in comparative example 1. In other words, irrespective of the distance between the first conductor section 102 and the second conductor section 202 in examples 1 and 2 being the same as in comparative example 1, it could be confirmed that the partial discharge start voltage was higher than that in comparative example 1.

From the abovementioned test results, the following is understood. In other words, in the power semiconductor apparatuses 1000C and 1000D according to the first and second comparative examples, when the interface between the first conductor section 102 and the sealing resin 10 or between the second conductor section 202 and the sealing resin 10 separates, by a high electric field being applied to the separation-section space 20 which arises as a result, a partial discharge occurs in the separation-section space 20. In contrast, the power semiconductor apparatuses 1000 and 1000A according to the first and second embodiments, by having the interposition section 300 in which a plurality of layers for voltage division are laminated, can divide the inter-conductor voltage applied between the first conductor section 102 and the second conductor section 202 between the plurality of insulation layers (the first insulation layer 304, the second insulation layer 305, and the third insulation layer 306) in the interposition section 300. Accordingly, in the case where a separation-section space 20 has arisen between the first conductor section 102 and the sealing resin 10 or between the second conductor section 202 and the sealing resin 10, it is possible to reduce an electric field applied to the separation-section space 20. As a result, as illustrated in FIG. 12, it is possible to suppress the occurrence of partial discharges, and increase the partial discharge start voltage.

In addition, since there are two insulation layers in the interposition section 300 in the first embodiment, which are the first insulation layer 304 and the second insulation layer 305, the voltage applied to the first conductor section 102 and the second conductor section 202 can be divided among the two insulation layers. In contrast to this, since there are three insulation layers in the interposition section 300 in the second embodiment, which are the first insulation layer 304, the second insulation layer 305, and the third insulation layer 306, the voltage applied to the first conductor section 102 and the second conductor section 202 can be divided among the three insulation layers. Accordingly, even if the distance between the first conductor section 102 and the second conductor section 202 is the same, the second embodiment can further increase the partial discharge start voltage.

By virtue of the embodiments of the present invention as described above, the following effects are achieved.

(1) The power semiconductor apparatuses 1000, 1000A, and 1000B are provided with the first conductor section 102 which is connected to the direct-current terminal 4 for transmitting direct-current power; the second conductor section 202 which is connected to the alternating-current terminal 5 for transmitting alternating-current power; the semiconductor element 1 which is disposed between the first conductor section 102 and the second conductor section 202 and is for converting the direct-current power to the alternating-current power; and the interposition section 300 which is disposed between the first conductor section 102 and the second conductor section 202. The interposition section 300 has the first conductor layer 301 which is connected to the first conductor section 102; the second conductor layer 302 which is connected to the second conductor section 202; and a plurality of insulation layers which is disposed between the first conductor layer 301 and the second conductor layer 302, with one or a plurality of third conductor layers 303 sandwiched between the plurality of insulation layers. As a result, it is therefore possible to provide the power semiconductor apparatuses 1000, 1000A, and 1000B which ensure insulating properties between the first conductor section 102 and the second conductor section 202, are small, and have superior reliability.

(2) In the power semiconductor apparatuses 1000, 1000A, and 1000B, the plurality of insulation layers includes the first insulation layer 304 disposed between the first conductor layer 301 and the third conductor layer 303, and the second insulation layer 305 disposed between the second conductor layer 302 and the third conductor layer 303. As a result, it is therefore possible to divide the inter-conductor voltage applied between the first conductor section 102 and the second conductor section 202 into a capacitive component for the first insulation layer 304 and a capacitive component for the second insulation layer 305, and thus, in the case where separation arises between the first conductor section 102 and the sealing resin 10 or between the second conductor section 202 and the sealing resin 10 and a separation-section space 20 is formed, it is possible to further reduce the voltage applied to the separation-section space 20. Accordingly, it is possible to effectively suppress occurrence of a partial discharge.

(3) In the power semiconductor apparatuses 1000A and 1000B, the plurality of insulation layers further includes the third insulation layer 306 disposed between third conductor layers 303. As a result, it is therefore possible to divide the inter-conductor voltage applied between the first conductor section 102 and the second conductor section 202 into a capacitive component for the first insulation layer 304, a capacitive component for the second insulation layer 305, and a capacitive component for the third insulation layer 306, and thus, in the case where separation arises between the first conductor section 102 and the sealing resin 10 or between the second conductor section 202 and the sealing resin 10 and a separation-section space 20 is formed, it is possible to further reduce the voltage applied to the separation-section space 20. Accordingly, it is possible to more effectively suppress occurrence of a partial discharge.

(4) The interposition section 300 is formed using a printed circuit board. As a result, it is therefore possible to easily form the interposition section 300.

(5) The interposition section 300 is disposed so as to surround the perimeter of the semiconductor element 1 in a plane orthogonal to a direction in which the first conductor section 102 and the second conductor section 202 overlap. As a result, it is therefore possible to reliably dispose the interposition section 300 in a range necessary to suppress occurrence of partial discharges.

(6) The power semiconductor apparatuses 1000, 1000A, and 1000B are further provided with the electrically-conductive spacer 3, which is disposed between the first conductor section 102 and the semiconductor element 1 or between the second conductor section 202 and the semiconductor element 1. As a result, it is therefore possible to ensure a distance necessary to ensure insulating properties between the first conductor section 102 and the second conductor section 202, irrespective of the thickness of the semiconductor element 1.

Note that, from among the embodiments described above, in the first embodiment, description is given for the power semiconductor apparatus 1000 in which the first insulation layer 304 and the second insulation layer 305, sandwiching a single third conductor layer 303 therebetween, are disposed as the interposition section 300 between the first conductor layer 301 and the second conductor layer 302. In addition, as the second and third embodiments, description is given for the power semiconductor apparatuses 1000A and 1000B in which the first insulation layer 304, the second insulation layer 305, and the third insulation layer 306, sandwiching two third conductor layers 303 therebetween, are disposed as the interposition section 300 between the first conductor layer 301 and the second conductor layer 302. However, the structure of the interposition section 300 in the present invention is not limited thereto. The interposition section 300 can be formed with an optionally defined structure so long as the interposition section 300 has a plurality of insulation layers which sandwich one or a plurality of third conductor layers 303 therebetween and which are disposed between the first conductor layer 301 and the second conductor layer 302.

The embodiments or various modifications described above are merely examples, and the present invention is not limited to the content of the above-described embodiments or modifications to the extent that the features of the invention are not impaired. In addition, various embodiments or modifications are described above, but the present invention is not limited to the content of these embodiments or modifications. Other aspects which can be considered to be within the scope of the technical concept of the present invention are also included in the scope of the present invention.

The disclosure of the following priority application is incorporated herein by reference.

Japanese Patent Application No. 2019-136453 (filed Jul. 24, 2019)

REFERENCE SIGNS LIST

1: Semiconductor element (IGBT)
2: Semiconductor element (diode)
3: Spacer
4: Direct-current terminal
5: Alternating-current terminal
6: Control terminal
7: Gate electrode
8: Metal wire
9: Joining member
10: Sealing resin
20: Separation-section space
101: Insulation member
102: First conductor section
103: Heat dissipation section
104: Gate connection conductor section
201: Insulation member
202: Second conductor section
203: Heat dissipation section
300: Interposition section
301: First conductor layer
302: Second conductor layer
303: Third conductor layer
304: First insulation layer
305: Second insulation layer
306: Third insulation layer
1000, 1000A, 1000B, 1000C, 1000D: Power semiconductor apparatus

The invention claimed is:

1. A power semiconductor apparatus, comprising:
a first conductor section connected to a direct-current terminal for transmitting direct-current power;
a second conductor section connected to an alternating-current terminal for transmitting alternating-current power;
a semiconductor element which is disposed between the first conductor section and the second conductor section and is for converting the direct-current power to the alternating-current power;
an interposition section disposed between the first conductor section and the second conductor section; and
a sealing resin which seals each of the components of the power semiconductor apparatus,
wherein
the interposition section has
a first conductor layer connected to the first conductor section,
a second conductor layer connected to the second conductor section, and
a plurality of insulation layers disposed between the first conductor layer and the second conductor layer, with one or a plurality of third conductor layers sandwiched between the plurality of insulation layers to be electrically insulated from the first conductor layer and the second conductor layer, characterized in that the one or the plurality of third conductor layers are not electrically connected to the first conductor section or the second conductor section.

2. The power semiconductor apparatus according to claim 1, wherein
the plurality of insulation layers includes a first insulation layer disposed between the first conductor layer and the one or a plurality of third conductor layers, and a second insulation layer disposed between the second conductor layer and the one or the plurality of third conductor layers.

3. The power semiconductor apparatus according to claim 2, wherein
the plurality of insulation layers further includes a third insulation layer disposed between the plurality of the third conductor layers.

4. The power semiconductor apparatus according to claim 1, wherein the interposition section is formed using a printed circuit board.

5. The power semiconductor apparatus according to claim 1, wherein the interposition section is disposed so as to surround the perimeter of the semiconductor element in a plane orthogonal to a direction in which the first conductor section and the second conductor section overlap.

6. The power semiconductor apparatus according to claim 1, further comprising:
an electrically-conductive spacer disposed between the first conductor section and the semiconductor element or between the second conductor section and the semiconductor element.

* * * * *